United States Patent [19]

Schueller et al.

[11] Patent Number: 5,663,530

[45] Date of Patent: Sep. 2, 1997

[54] WIRE BOND TAPE BALL GRID ARRAY PACKAGE

[75] Inventors: Randolph D. Schueller; Anthony R. Plepys; Howard E. Evans, all of Austin, Tex.

[73] Assignee: Minnesota Mining and Manufacturing Company, St. Paul, Minn.

[21] Appl. No.: 509,779

[22] Filed: Aug. 1, 1995

[51] Int. Cl.[6] .................................................. H05K 1/02
[52] U.S. Cl. ........................ 174/260; 174/261; 174/254; 361/761; 361/765
[58] Field of Search .............................. 174/254, 260, 174/261, 262, 263, 259, 255; 361/778, 761, 762, 764, 765, 749; 439/67, 77; 257/737, 738

[56] References Cited

U.S. PATENT DOCUMENTS

| | | |
|---|---|---|
| 5,045,921 | 9/1991 | Lin et al. .................................. 357/74 |
| 5,225,966 | 7/1993 | Basavanhally et al. ................. 361/406 |
| 5,296,651 | 3/1994 | Gurrie et al. ............................. 174/254 |
| 5,359,222 | 10/1994 | Okumoto et al. . |
| 5,376,588 | 12/1994 | Pendse ..................................... 437/211 |
| 5,397,921 | 3/1995 | Karnezos .................................. 257/779 |
| 5,572,405 | 11/1996 | Wilson et al. ............................ 361/705 |
| 5,578,796 | 11/1996 | Bhatt et al. .............................. 174/260 |

FOREIGN PATENT DOCUMENTS 0 011 013 A1   5/1980   European Pat. Off. .

OTHER PUBLICATIONS

"Semi Conductor Device" Patent Abstract of Japan, Publication No. JP8064635, 8, Mar. 1996 Mitsui High Tec, Inc., Inventors: Atsushi, et al.

"Semi Conductor Device And Manufacturing Of Manufacture Of Semiconductor Mounting Board" Patent abstract of Japan, Publication No. JP8008352, 122.01.96, Hitachi Cable Ltd., Inventor: Mamoru.

*Primary Examiner*—Laura Thomas
*Attorney, Agent, or Firm*—Gary L. Griswold; Walter N. Kirn; Matthew B. McNutt

[57] ABSTRACT

A tape ball grid array package reverses the usual attachment of flexible circuitry to a stiffener so that the circuit traces face the stiffener rather than away from the stiffener as is conventional. This construction allows the elimination of a previously necessary solder mask and so reduces the cost to produce the package.

6 Claims, 2 Drawing Sheets

WIRE BOND TAPE BALL GRID ARRAY PACKAGE

FIELD OF THE INVENTION

The present invention relates to tape ball grid array packaging of electronic devices.

BACKGROUND OF THE INVENTION

There is a recognized need in the electronics industry for a tape ball grid array package on which a chip can be attached by wire bonding. Tape ball grid array packages which allow attachment of chips through thermocompression bonding or solder ball flip chip are currently on the market, however, only 2% of chips are bonded by these methods due to the higher costs and lack of infrastructure, whereas the remaining 98% are wire bonded. The tape ball grid array wire bond designs currently being implemented all require a covercoat or solder mask since solder balls are attached on the circuit side of the flexible substrate. This can be a costly design to manufacture due to the severity of the tape ball grid array solder mask requirements. The solder mask must define the solder ball pads to tolerances less than ±50 micrometers to ensure closely matched pad sizes. Unequal pad sizes can result in a few weak solder joints which cause the package to fail prematurely upon thermal cycle testing. Since inexpensive screen printing processes cannot meet these tolerance requirements, more expensive processes such as photo imaging or laser ablation must be used. In addition, the solder mask must withstand eutectic solder reflow temperatures of near 220° C. for short periods (2–4 minutes) and 150° C. for extended periods (1000 hours). If higher melting temperature solder alloys such as 10% Tin/90% Lead are to be used, the solder mask must withstand temperatures near 320° C. Also, since the is being attached to a flexible circuit, the mask must be flexible itself, therefore many of the masks used in the circuit board industry are not suitable.

SUMMARY OF THE INVENTION

This invention provides a wire bondable tape ball grid array package which does not require the added process of depositing a solder mask. The polyimide substrate itself provides the solder mask for the package, and thus the package can be made at much lower cost.

Flexible circuitry is adhered to a metal stiffener with the circuit side of the flexible circuitry facing the stiffener rather than away from the stiffener as is conventional. Since the solder balls are attached to the side of the flexible circuitry opposite the circuit traces, the polyimide of the flexible circuitry acts as a solder mask to prevent the solder of the solder balls from spreading along the metal circuitry.

The key ingredient which makes this design concept feasible is the implementation of the correct adhesive used to bond the flexible circuitry to the stiffener. The adhesive must have the flow characteristics which allow filling in of the regions between the circuit traces so as not to leave voids or air pockets between the flexible circuitry and the stiffener. The adhesive, however, must not flow to the extent that it begins to cover the wire bond pads which would make the wire bonding process impossible. The adhesive must also be rigid enough at the elevated temperatures required for wire bonding (180°–200° C.) to prevent absorption of the ultrasonic bond energy necessary to create a reliable metallurgical bond. Finally, the ionic potential of the adhesive must be low and the adhesive must not diffuse onto the bond pad after long periods of time.

An adhesive with the required properties has been identified and demonstrated in practice. The adhesive which provided the best results is a thermoplastic polyimide available from E. I. Dupont de Nemours of Wilmington, Del. with the trade name KJ. This particular adhesive was supplied in a 50 μm thick film and had a glass transition temperature of 220° C., however other thermoplastic polyimide adhesives with different thickness and glass transition temperatures may also work adequately. This adhesive was placed between the circuitry and the stiffener and laminated at a temperature of 350° C. and a pressure of 400–1000 psi for a time of 20–60 seconds. These conditions allowed the adhesive to completely fill in the areas between the circuit traces but prevented adhesive from flowing onto the bond pads. Since the chemical makeup of the adhesive is very similar to that of the polyimide circuit substrate there is no danger of contamination to the bond pads from ionic or diffusion effects.

A further embodiment of this design is to insert a lower stiffness modulus adhesive between the thermoplastic polyimide adhesive and the stiffener to provide additional compliancy for improved thermal cycle fatigue life of the solder joints. Bonding conditions similar to those stated above were used. Although the preferred material is silicone based pressure sensitive adhesives applied at a thickness of 50 and 100 μm, any other adhesive with a stiffness modulus lower than that of KJ would be effective.

BRIEF DESCRIPTION OF THE DRAWINGS

The present invention will be described with respect to the accompanying drawings, wherein like numbers refer to like parts in the several views, and wherein.

DESCRIPTION OF THE PREFERRED EMBODIMENT

Figure 1:
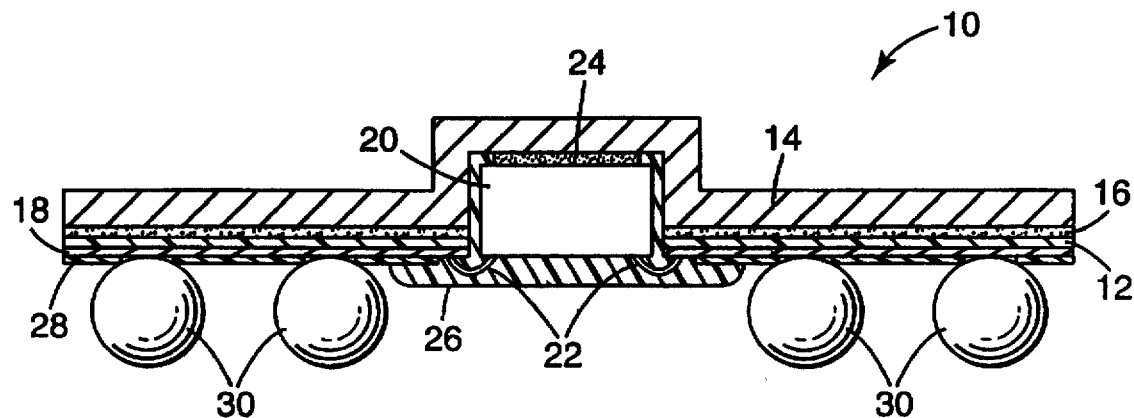
FIG. 1 is a cross-sectional view of a tape ball grid array package according to the prior art.

FIG. 1 illustrates a tape ball grid array package, generally indicated as 10, according to the prior art. This package 10 includes a polyimide base sheet 12 attached to a metal stiffener 14 by means of an adhesive 16. The polyimide sheet 12 has copper traces 18 deposited thereon which define electrical circuits. The traces 18 are connected to an electronic device 20 by thin wires 22, usually by the wire bonding process. The electronic device 20 is secured to the stiffener 14 by an adhesive 24 and covered by an encapsulant 26 for protection.

According to this prior construction, the traces 18 are disposed facing away from the stiffener 14 and are covered by a solder mask or covercoat 28 which define areas (usually circular) for placement and reflow soldering of solder balls 30 to the traces 18. This solder mask 28 is necessary to prevent the solder balls 30 from flowing out onto the traces 18 during the attachment process. The solder mask 28 is usually quite expensive due to the tight tolerances required to image each solder ball area. The object of the present invention is to eliminate the solder mask 28 previously required and so eliminate this expensive assembly step.

Figure 2:
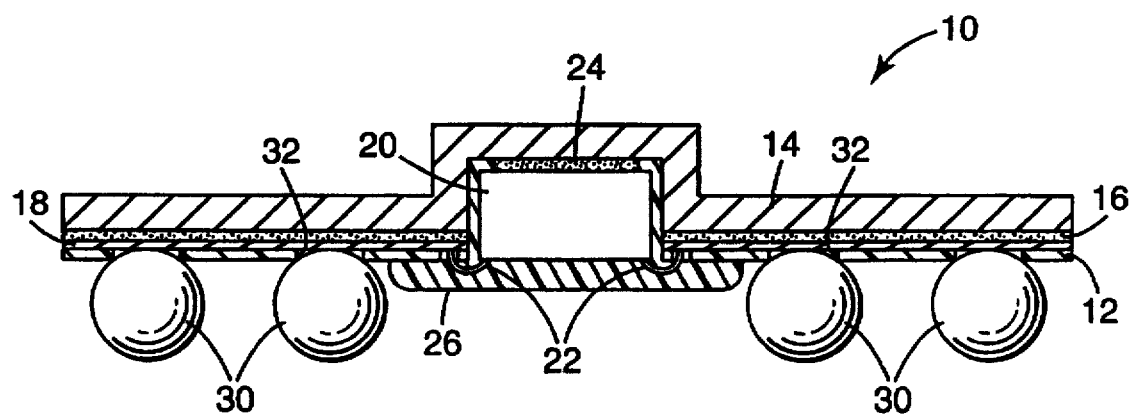
FIG. 2 is a cross-sectional view of a tape ball grid array package according to one embodiment of the present invention.

Elimination of the solder mask 28 is accomplished as illustrated in FIG. 2 by reversing the polyimide sheet 12 and its copper traces 18 with respect to the stiffener 14. In this construction, holes 32 are cut directly into the polyimide sheet 12 for the solder balls 30 and the polyimide of the sheet 12 itself act as a solder mask to prevent spreading of the solder as the solder balls 30 are attached to the traces 18, usually by reflow soldering.

Figure 5:
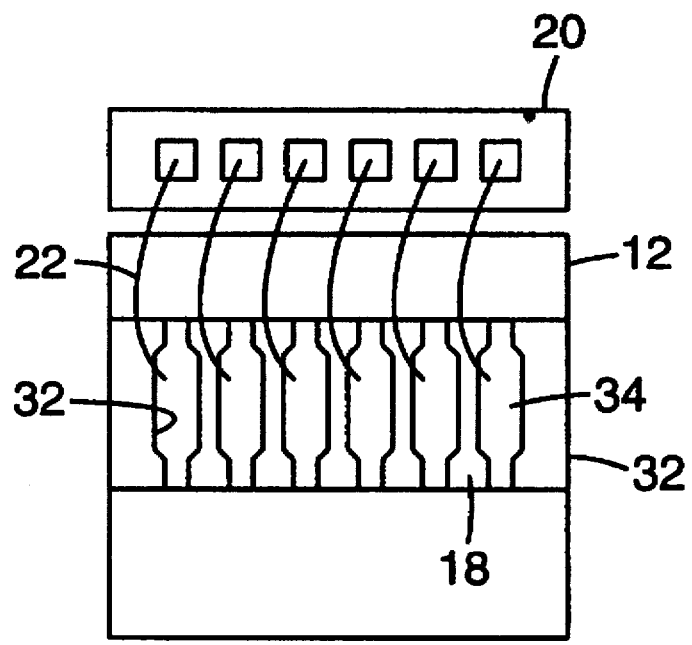
FIG. 5 is a top, plan view of a portion of a tape ball grid array according to either embodiment of the present invention.

The key ingredient which makes this design concept feasible is the implementation of the correct adhesive 16. The adhesive 16 must have the flow characteristics which allow filling in of the regions between the circuit traces 18 so as not to leave voids or air pockets between the polyimide sheet 12 and the stiffener 14. The adhesive 16, however, must not flow to the extent that it begins to cover wire bond pads 34 which would make the wire bonding process impossible. These pads 34 are best seen in FIG. 5 which illustrates a few of the wires 22 and their attachment points at the electronic device 20 and the copper traces 18 formed on the polyimide sheet 12.

The adhesive 16 must also be rigid enough at the elevated temperatures required for wire bonding (150°–200° C.) to prevent absorption of the ultrasonic bond energy necessary to create a reliable metallurgical bond. Finally, the ionic potential of the adhesive 16 must be low and the adhesive 16 must not diffuse onto the bond pad 34 after long periods of time.

An adhesive 16 with the required properties has been identified and demonstrated in practice. The adhesive 16 which provides the best results is a thermoplastic polyimide available from E. I. Dupont de Nemours (Wilmington, Del.) with the trade name KJ. This particular adhesive was applied 50 μm thick and had a glass transition temperature of 220° C., however other thermoplastic polyimide adhesives with different thicknesses and glass transition temperatures may also work adequately. This adhesive 16 was placed between the circuitry and the stiffener and laminated at a temperature of 350° C. and a pressure of 100 psi for a time of 20–60 seconds. These conditions allowed the adhesive 16 to completely fill in the areas between the copper traces 18 but prevented adhesive 16 from flowing onto the bond pads 34. Since the chemical makeup of the adhesive 16 is very similar to that of the polyimide circuit substrate 12 there is no danger of contamination to the bond pads 34 from ionic or diffusion effects.

The complex viscosity η* of the preferred adhesive has been found to be approximately constant at about $1.5 \times 10^5$ Pa•s over a range of 240°–420° C. Other adhesives tested exhibited a complex viscosity at desired temperatures of less than $2 \times 10^4$ Pa•s which was found to be too low to function correctly in that the adhesive overflowed the wire bond pads 34.

In addition, the adhesive 16 is required to be rigid enough at elevated temperature (180°–200° C.) to allow wire bonding to the pads. If an adhesive has a stiffness at these temperatures which is too low, ultrasonic energy will be absorbed to the detriment of the wire bonding process, possibly to the extent that the bonding process cannot be accomplished. A stiffness G' of at least $1 \times 10^6$ Pa is thought necessary to permit efficient wire bonding, with the preferred adhesive 16 exhibiting a stiffness G' of approximately $7 \times 10^8$ Pa in the range of 150°–200° C.

Figure 3:
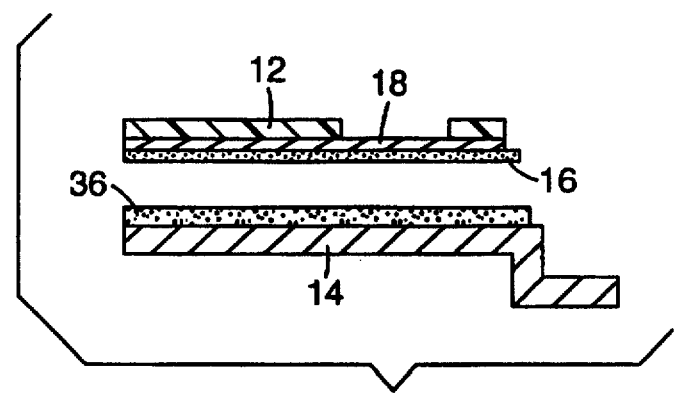
FIG. 3 is an exploded, cross-sectional view of a portion of a tape ball grid array package according to a second embodiment of the present invention.
Figure 4:
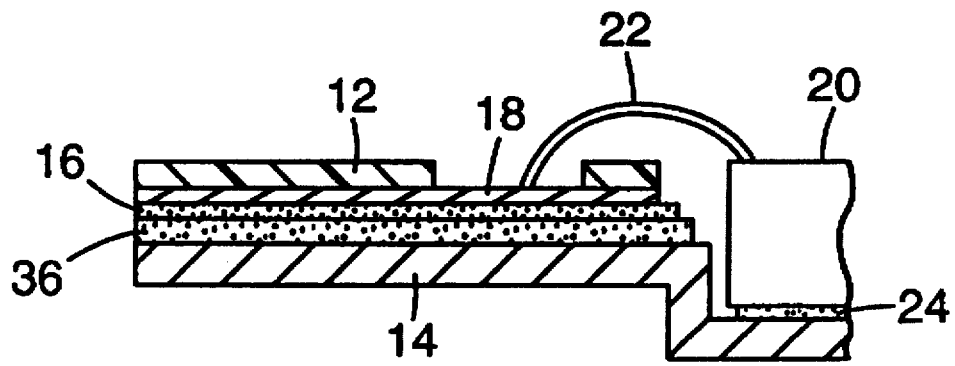
FIG. 4 is a cross-sectional view similar to FIG. 3, but after final assembly.

FIGS. 3 and 4 illustrate a further embodiment of the invention wherein an additional layer of adhesive 36 is interposed between the adhesive 16 bonded to the polyimide sheet 12 and the stiffener 14. The purpose of this layer is to provide additional flexibility and compliancy of the assembly for improved thermal cycle fatigue life of the solder joints. This additional adhesive is softer than the adhesive 16 and preferably is applied in a thicker layer than the adhesive 16 adjacent the polyimide sheet 12. The preferred materials are silicone based pressure sensitive adhesives, which have a stiffness modulus approximately four orders of magnitude lower than the adhesive 16, but any adhesive with a stiffness modulus lower than that of the adhesive 16 which is able to withstand the temperatures encountered during assembly would serve as well.

Although the invention has been described with respect to only a limited number of embodiments, it will be appreciated that many modifications will be apparent to those skilled in the art. For example, the materials described may be substituted for with materials having similar properties and the shapes of various structures may be modified. In particular, the solder balls need not be spherical but rather could be any of a number of shapes, with cylindrical columns being a particularly useful alternative. Also, circuit traces could be disposed on both sides of the polyimide base rather than only on one side as shown.

The invention claimed is:

1. An improved package for an electronic device including a polymeric base sheet, electrically conductive traces formed on at least one side of the base sheet, a series of spaces between portions of a number of the conductive traces, at least one opening in the polymeric base sheet which exposes at least one bond pad for connection to the electronic device, a stiffener and an adhesive for bonding the base sheet to the stiffener, the improvement comprising bonding the base sheet to the stiffener with conductive traces adjacent the stiffener by means of a bonding adhesive having a sufficiently low complex viscosity at bonding temperature to substantially completely fill the spaces between the conductive traces and a sufficiently high complex viscosity at bonding temperature to prevent the adhesive from flowing over the bond pad.

2. A package for an electronic device according to claim 1 further including a layer of cushioning adhesive between the bonding adhesive and the stiffener, the cushioning adhesive having less stiffness than the bonding adhesive at temperatures at which the electronic device is normally used.

3. A package for an electronic device according to claim 1 wherein the polymeric base further includes holes terminating at conductive traces and shaped solder objects soldered to the conductive traces.

4. A package for an electronic device according to claim 3 wherein the shaped solder objects are spherical.

5. A package for an electronic device according to claim 2 wherein the polymeric base further includes holes terminating at conductive traces and shaped solder objects soldered to the conductive traces.

6. A package for an electronic device according to claim 5 wherein the shaped solder objects are spherical.

* * * * *